United States Patent
Bao et al.

(10) Patent No.: US 6,174,797 B1
(45) Date of Patent: Jan. 16, 2001

(54) SILICON OXIDE DIELECTRIC MATERIAL WITH EXCESS SILICON AS DIFFUSION BARRIER LAYER

(75) Inventors: Tien-I Bao; Syun-Ming Jang, both of Hsin-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/435,678

(22) Filed: Nov. 8, 1999

(51) Int. Cl.⁷ .................................................. H01L 21/4763
(52) U.S. Cl. .......................... 438/624; 438/643; 438/653
(58) Field of Search .................................... 438/624, 706, 438/656, 789, 627, 643, 653; 205/666, 667; 216/2, 67, 74, 76, 79

(56) References Cited

U.S. PATENT DOCUMENTS

| | | | |
|---|---|---|---|
| 5,567,304 | * 10/1996 | Datta et al. ............................ | 205/666 |
| 6,004,883 | * 12/1999 | Yu et al. ................................ | 438/706 |
| 6,019,906 | * 2/2000 | Jang et al. ............................. | 216/2 |
| 6,022,802 | * 2/2000 | Jang ..................................... | 438/656 |
| 6,043,167 | * 3/2000 | Lee et al. ............................. | 438/789 |
| 6,100,202 | * 8/2000 | Lin et al. .............................. | 438/734 |

* cited by examiner

Primary Examiner—David Nelms
Assistant Examiner—Phuc T. Dang
(74) Attorney, Agent, or Firm—George O. Saile; Stephen B. Ackerman

(57) ABSTRACT

A method for forming upon a substrate employed within a microelectronics fabrication a first dielectric layer, an intermediate diffusion barrier dielectric layer and a conductor layer which comprise an inter-level metal dielectric (IMD) layer with attenuated diffusion between the dielectric layers and conductor layer. There is first provided a substrate employed within a microelectronics fabrication. There is then formed upon the substrate a patterned microelectronics layer. There is then formed over the substrate a first dielectric layer. There is then formed over the substrate a diffusion barrier dielectric layer. There is then formed over the substrate a conductor layer to complete an inter-level metal dielectric (IMD) layer with attenuated inter-diffusion between the dielectric layers and conductor layer.

18 Claims, 4 Drawing Sheets

SILICON OXIDE DIELECTRIC MATERIAL WITH EXCESS SILICON AS DIFFUSION BARRIER LAYER

BACKGROUND OF THE INVENTION

1. Field of the Invention

The present invention relates generally to the field of microelectronics fabrications, and more particularly to the field of dielectric layers employed within microelectronics fabrications.

2. Description of the Related Art

In order to fabricate microelectronics devices it is necessary to employ layers of dielectric material to electrically insulate patterned conductor material layers which serve to interconnect the devices in the microelectronics fabrication. As microelectronics devices have become more complex and densely populated, the requirements on the conductor and dielectric layers have become more stringent. The need to minimize power requirements and resistive losses has led to the employment of materials with higher electrical conductivity such as copper, for example. These conductor layers are often fabricated in complex and sophisticated configurations such as inlaid or damascene designs in order to maintain surface planarity in multi-layer structures. The conductor layer may act as a diffusion barrier towards substances emanating from other layers or, conversely, the conductor layer may require a barrier layer to protect it from deleterious substances or to protect other layers from itself.

Dielectric materials which are useful for formation of dielectric layers employed within microelectronics fabrications often are desired to have low dielectric constants to increase circuit performance. Such low dielectric constant materials as organic polymer dielectric materials or fluorine-doped silicon containing glass dielectric materials are commonly employed. Likewise, the increased circuit density and complexity has also led to multiple conductor layers and dielectric layers being fabricated into inter-level metal dielectric (IMD) layers to be able to accommodate all the requirements of increased circuit density and interconnectability. Although methods and materials are available which are satisfactory for these purposes in general, the employment of multi-level conductor layers and low dielectric constant dielectric layers is not without problems.

For example, the dielectric material selected for optimum electrical performance may require a method of formation or a composition which is incompatible with the physical or chemical properties of the conductor material with which the dielectric layer is in intimate contact.

It is thus towards the goal of forming a dielectric layer with an adjacent dielectric diffusion barrier material to protect conductor materials such as copper that the present invention is generally directed.

Various methods have been disclosed for forming conductor layers such as copper and a diffusion barrier layer upon an adjacent dielectric layer to attenuate damage to conductor material from nearby diffusing deleterious species.

For example, Cheung et al., in U.S. Pat. No. 5,785,236, disclose a method for forming aluminum or gold wire bonds to copper bonding pads. The method employs copper bonding pads supported within an interlayer dielectric which may be composed of silicon nitride, Further, Bhattacharya et al., in U.S. Pat. No. 5,811,870, disclose a method for forming an anti-fuse structure which can be transformed from a non-conductive to a conductive state by application of a voltage across a two-layer insulator. The two-layer structure employs a dielectric layer and an injector layer. The latter employs a silicon-rich silicon oxide or silicon nitride layer.

Yet further, Cleeves et al., in U.S. Pat. No. 5,830,804, disclose a method for forming an encapsulated dielectric layer. The method employs a disposable post material over which is formed a dielectric layer which completely surrounds the post material. A second and third dielectric layer are formed over the encapsulated post and then a portion of the third layer is selectively removed to reveal the disposable post, which is then removed to form an opening in the dielectric layers.

Yet further still, Boeck et al., in U.S. Pat. No. 5,880,018, disclose a method for forming an inter-level metal dielectric (IMD) layer with reduced cross-talk. The method employs a selective placement of a low dielectric constant dielectric material with a dielectric constant equal or less than 3.5 within the IMD layer, and employs various conductor materials.

Finally, Wong et al., in U.S. Pat. No. 5,946,601, disclose a method for forming a layer which can function as a liner or barrier layer to separate a low dielectric constant dielectric layer from surrounding metal layers. The method employs a layer of amorphous hydrogenated carbon nitride and amorphous carbon nitride to separate a low dielectric constant dielectric material containing fluorine from a metal layer.

Desirable in the art of microelectronics fabrication are additional methods for forming an inter-level metal (IMD) layer within which is formed a diffusion barrier dielectric layer and employing conductor layers which are sensitive to corrosion such as copper.

It is towards this goal that the present invention is generally and more specifically directed.

SUMMARY OF THE INVENTION

A first object of the present invention is to provide a method for forming upon a substrate employed within a microelectronics fabrication a diffusion barrier dielectric layer intermediate between a dielectric layer and a conductor layer to attenuate inter-diffusion between the dielectric layer and the conductor layer A second object of the present invention is to provide a method in accord with the first object of the present invention, where the diffusion barrier dielectric layer is formed employing silicon-rich silicon oxide dielectric material deposited employing plasma enhanced chemical vapor deposition (PECVD) upon fluorine-doped low dielectric constant dielectric material.

A third object of the present invention is to provide a method in accord with the first object of the present invention and the second object of the present invention, where there is formed an inter-level metal dielectric (IMD) layer comprising a layer of fluorine-doped low dielectric constant dielectric material, an intermediate silicon rich silicon oxide dielectric diffusion barrier layer and a copper conductor layer.

A fourth object of the present invention is to provide a method in accord with the first object of the present invention, the second object of the present invention and the third object of the present invention, where the method is readily commercially implemented.

In accord with the objects of the present invention, there is provided a method for forming upon a substrate employed within a microelectronics fabrication a dielectric layer, an intermediate diffusion barrier dielectric layer and a conductor layer which constitute an inter-level metal dielectric (IMD) layer with attenuated inter-diffusion. To practice the invention, there is provided a substrate employed within a microelectronics fabrication. There is formed upon the substrate a patterned microelectronics layer and a dielectric layer. There is then formed over the substrate a silicon-rich silicon oxide dielectric layer employing plasma enhanced chemical vapor deposition (PECVD) which acts as a diffusion barrier. There is then formed over the diffusion barrier dielectric layer a copper conductor layer to complete an inter-level metal dielectric (IMD) layer with attenuated inter-diffusion between the dielectric layers and the conductor layer.

The present invention may be applied to substrates employed within microelectronics fabrications including integrated circuit microelectronics fabrications, charge coupled device microelectronics fabrications, solar cell microelectronics fabrications, radiation emitting microelectronics fabrications, ceramics substrate microelectronics fabrications and flat panel display microelectronics fabrications.

The present invention uses methods and materials which are known in the art of microelectronics fabrications, but in a novel order and fashion in order to achieve the results of the present invention. Therefore the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming an inter-level metal dielectric (IMD) layer upon a substrate employed within a microelectronics fabrication wherein the dielectric layer has formed an intermediate diffusion barrier dielectric layer between it and the conductor layer, with attenuated inter-diffusion.

First Preferred Embodiment

Figure 1:
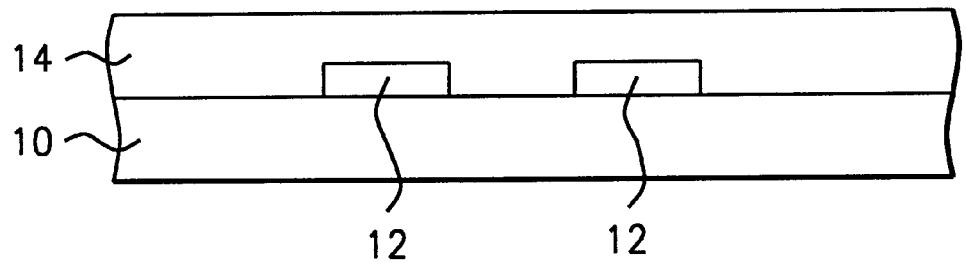
FIG. 1, FIG. 2, FIG. 3 are a series of schematic cross-sectional diagrams illustrating the formation upon a substrate employed within a microelectronics fabrication in accord with a general embodiment of the present invention of a dielectric layer with an intermediate diffusion barrier dielectric layer and a conductor layer to form an inter-level metal dielectric (IMD) layer with attenuated interdiffusion.
Figure 2:
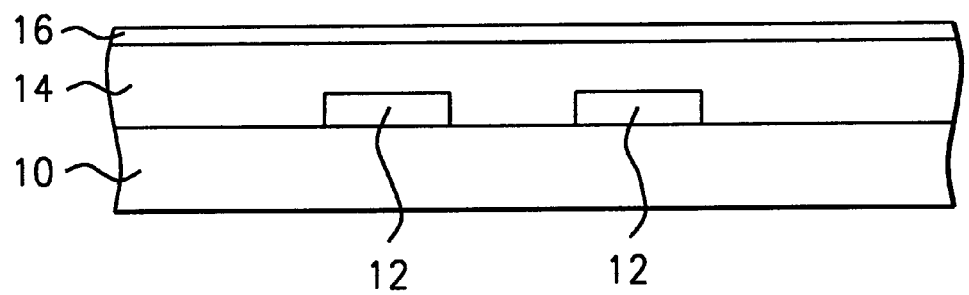
Figure 3:
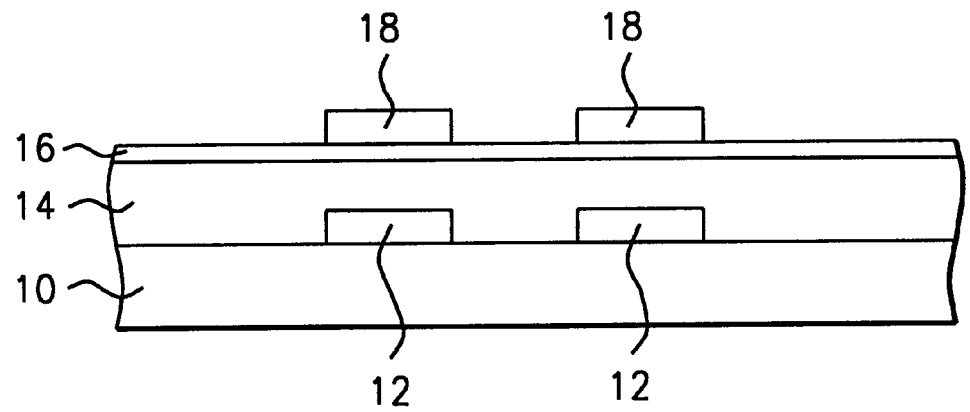

FIG. 1 to FIG. 3 illustrate the formation of an inter-level metal dielectric (IMD) layer having an intermediate diffusion barrier dielectric layer between it and the conductor layer in accord with a general embodiment of the present invention which constitutes a first preferred embodiment of the present invention. FIG. 1 is a schematic cross-sectional diagram of a substrate at an early stage in its fabrication in accord with the first preferred embodiment of the present invention.

Shown in FIG. 1 is a substrate 10 over which is formed a patterned microelectronics layer 12. Formed over the substrate is a dielectric layer 14.

With respect to the substrate 10 shown in FIG. 1, the substrate 10 is formed of material selected from the group including but not limited to microelectronics conductor material, microelectronics semiconductor material and microelectronics dielectric material. The substrate 10 may be the substrate itself employed within a microelectronics fabrication, or alternatively the substrate 10 may be any of several layers of microelectronics material formed over the substrate. Preferably the substrate 10 is a semiconductor substrate employed within a microelectronics fabrication selected from the group consisting of integrated circuit microelectronics fabrications, charge coupled device microelectronics fabrications, solar cell microelectronics fabrications, ceramic substrate microelectronics fabrications, optoelectronics microelectronics fabrications and flat panel display microelectronics fabrications.

With respect to the patterned microelectronics layer 12 shown in FIG. 1, the patterned microelectronics layer 12 is formed employing materials selected from the group consisting of microelectronics conductor materials, microelectronics semiconductor materials and microelectronics dielectric materials, deposited and patterned employing methods as are well known in the art of microelectronics fabrication. Preferably the patterned microelectronics layer 12 is a microelectronics conductor layer.

With respect to the dielectric layer 14 shown in FIG. 1, the dielectric layer 14 is a layer of dielectric material formed employing methods including but not limited to chemical vapor deposition (CVD), plasma assisted chemical vapor deposition (PECVD) methods, high density plasma chemical vapor deposition (HDP-CVD) methods, sub-atmospheric pressure thermal chemical vapor deposition (SACVD) methods, low pressure chemical vapor deposition (LPCVD) methods, spin-on-glass (SOG) methods and spin-on-polymer (SOP) methods. Preferably the dielectric layer 14 is formed employing a low dielectric constant dielectric material such as fluorine-doped silicon containing glass (FSG) dielectric material or, alternatively, fluorine-doped carbon containing dielectric material.

Referring now more particularly to FIG. 2, there is shown a schematic cross-sectional diagram illustrating the results of further processing of the microelectronics fabrication whose schematic cross-sectional diagram is shown in FIG. 1 in accord with the first preferred embodiment of the present invention. Shown in FIG. 2 is a microelectronics fabrication otherwise equivalent to the microelectronics fabrication shown in FIG. 1, but where there has been formed over the substrate a diffusion barrier dielectric layer 16.

With respect to the diffusion barrier dielectric layer 16 shown in FIG. 2, the diffusion barrier dielectric layer 16 is formed from a silicon-rich silicon oxide dielectric material employing plasma enhanced chemical vapor deposition (PECVD) in accord with the following process: (1) silicon source gas silane ($SiH_4$); (2) carrier gases nitrogen, argon and helium; (3) power from about 100 to about 5000 watts;

(4) temperature from about 200 to about 400 degrees centigrade; and (5) pressure from about 1 milliTorr to about 100 Torr. Preferably the silicon rich silicon oxide diffusion barrier dielectric layer is formed to a thickness of from about 50 to about 5000 angstroms. The preferred degree of silicon enrichment of the silicon rich silicon oxide dielectric layer is obtained when the refractive index of the material is from about 1.47 to about 1.8.

Referring now more particularly to FIG. 3, there is shown a schematic cross-sectional drawing illustrating the results of further processing of the microelectronics fabrication whose schematic cross-sectional drawing is shown in FIG. 2 in accord with the first preferred embodiment of the present invention. Shown in FIG. 3 is a microelectronics fabrication otherwise equivalent to the microelectronics fabrication shown in FIG. 2, but where there has been formed a patterned microelectronics conductive layer 20 to complete an inter-level metal (IMD) dielectric layer.

With respect to the patterned microelectronics conductive layer 20 shown in FIG. 3, the patterned microelectronics conductive layer 20 is selected from microelectronics conductor materials including but not limited to microelectronics metals, microelectronics conductive compounds, microelectronics alloys and microelectronics semiconductor materials, formed employing methods such as vacuum evaporation, chemical vapor deposition (CVD), physical vapor deposition (PVD) sputtering and electrodeposition (ED) methods, and patterned employing photolithographic methods and materials as are known in the art of microelectronics fabrication.

The present invention provides a method for forming an inter-level metal dielectric (IMD) layer comprising a dielectric layer and a conductive layer with an intermediate diffusion barrier dielectric layer between them to attenuate inter-diffusion.

Second Preferred Embodiment

Figure 4:
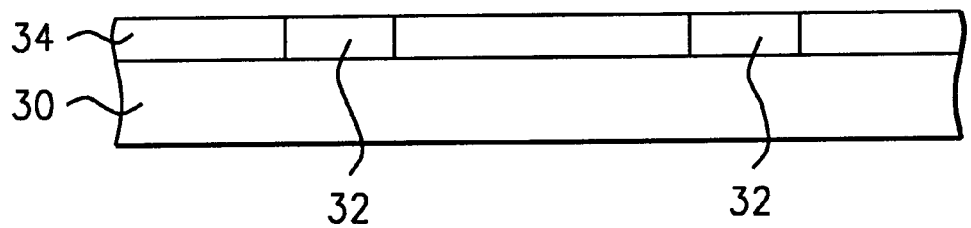
FIG. 4, FIG. 5, FIG. 6, FIG. 7, and FIG. 8 are a series of schematic cross-sectional diagrams illustrating the formation upon a semiconductor substrate employed within an integrated circuit microelectronics fabrication, in accord with a more specific embodiment of the present invention, of a fluorine containing low dielectric constant dielectric layer, an intermediate silicon-rich silicon oxide diffusion barrier dielectric layer and a copper conductor layer, to form an inter-level metal dielectric (IMD) layer with attenuated diffusion of fluorine species.

FIG. 4 to FIG. 8 is a series of schematic cross-sectional diagrams illustrating the formation upon a semiconductor substrate employed within an integrated circuit microelectronics fabrication an inter-level metal dielectric (IMD) layer comprising a low dielectric constant dielectric layer having a diffusion barrier dielectric layer intermediate between it and a copper conductor layer FIG. 4 is a schematic cross-sectional diagram of an integrated circuit microelectronics fabrication at an early stage in its fabrication in accord with a more specific embodiment of the present invention which constitutes a second preferred embodiment of the present invention.

Shown in FIG. 4 is a semiconductor substrate 30 upon which is formed a patterned microelectronics layer 32 and a low dielectric constant dielectric layer 34.

With respect to the semiconductor substrate 30 showing in FIG. 4, the semiconductor substrate 30 is analogous to the substrate 10 shown in FIG. 1 of the first preferred embodiment of the present invention. Preferably the semiconductor substrate 30 is a silicon single crystal substrate of (100) crystalline orientation With respect to the patterned microelectronics layer 32 shown in FIG. 4, the patterned microelectronics layer 32 is analogous to the patterned microelectronics layer 12 shown in FIG. 1 of the first preferred embodiment of the present invention.

With respect to the low dielectric constant dielectric layer 34 shown in FIG. 2, the low dielectric constant dielectric layer 34 is analogous to the dielectric layer 14 shown in FIG. 1 of the first preferred embodiment of the present invention. Preferably the low dielectric constant dielectric layer 34 is a fluorine-doped silicon oxide dielectric glass (FSG) material formed employing the following process: (1) silicon source gases silage ($SiF_4$) and tetrafluoromethane ($SiF_4$); (2) oxidizing gas $O_2$; (3) carrier gases helium and argon; (4) power from about 100 to about 5000 watts; (4) temperature form about 200 to about 400 degrees centigrade; and (5) pressure from about 1 milliTorr to about 100 Torr. Preferably the FSG layer is formed to a thickness of from about 100 to about 10,000 angstroms.

Figure 5:
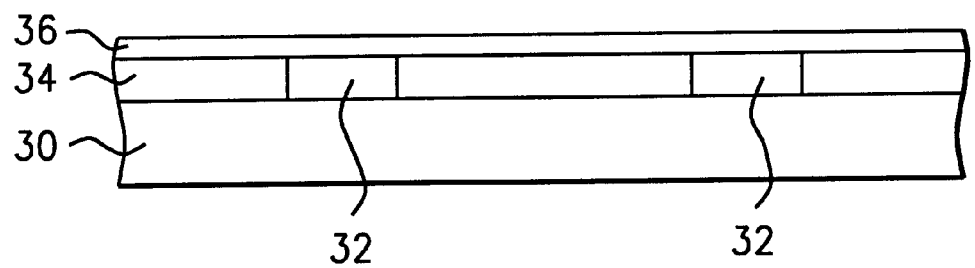

Referring now more particularly to FIG. 5, there is shown a schematic cross-sectional diagram illustrating the results of further processing of the integrated circuit microelectronics fabrication whose schematic cross-sectional diagram is shown in FIG. 4 in accord with the second preferred embodiment of the present invention. Shown in FIG. 5 is an integrated circuit microelectronics fabrication otherwise equivalent to the integrated circuit microelectronics fabrication shown in FIG. 4, but where there has been formed over the semiconductor substrate a silicon rich silicon oxide diffusion barrier dielectric layer 36.

With respect to the silicon rich silicon oxide diffusion barrier dielectric layer 36, the silicon rich silicon oxide diffusion barrier layer 36 is equivalent or analogous to the diffusion barrier dielectric layer 16 shown in FIG. 2 of the first preferred embodiment of the present invention.

Figure 6:
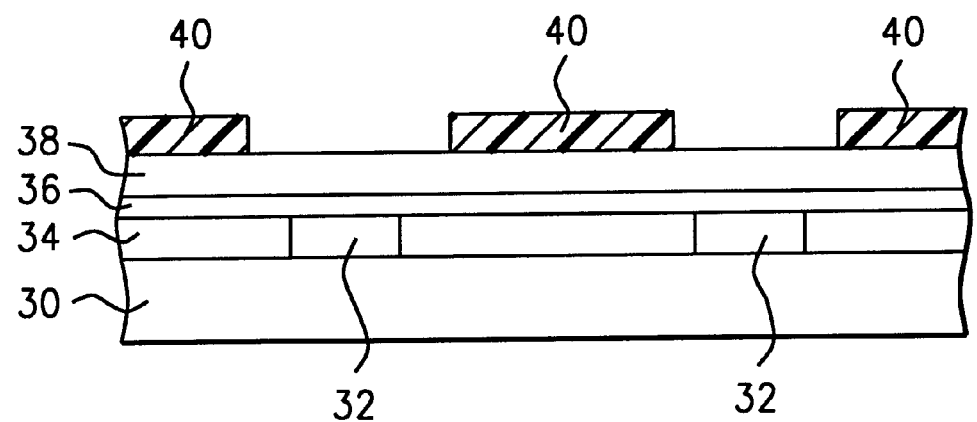

Referring now more particularly to FIG. 6, there is shown a schematic cross-sectional diagram illustrating the results of further processing of the integrated circuit microelectronics fabrication shown in FIG. 5 in accord with the second preferred embodiment of the present invention. Shown in FIG. 6 is an integrated circuit microelectronics fabrication otherwise equivalent to the integrated circuit microelectronics fabrication shown in FIG. 5, but where there has been formed over the semiconductor substrate a second dielectric layer 38. Formed over the substrate is a patterned photoresist etch mask layer 40.

With respect to the dielectric layer 38 shown in FIG. 6, the dielectric layer 38 is a dielectric layer formed employing methods including but not limited to chemical vapor deposition (CVD) methods, plasma enhanced chemical vapor deposition methods (PECVD) methods, high density plasma chemical vapor deposition (HDP-CVD) methods, sub-atmospheric pressure thermal chemical vapor deposition (SACVD) methods, spin-on-glass (SOG) methods and spin-on-polymer (SOP) methods. Preferably the second dielectric layer is a silicon containing dielectric layer formed employing plasma enhanced chemical vapor deposition (PECVD) or, alternatively, formed employing high density plasma chemical vapor deposition (HDP-CVD).

Figure 7:
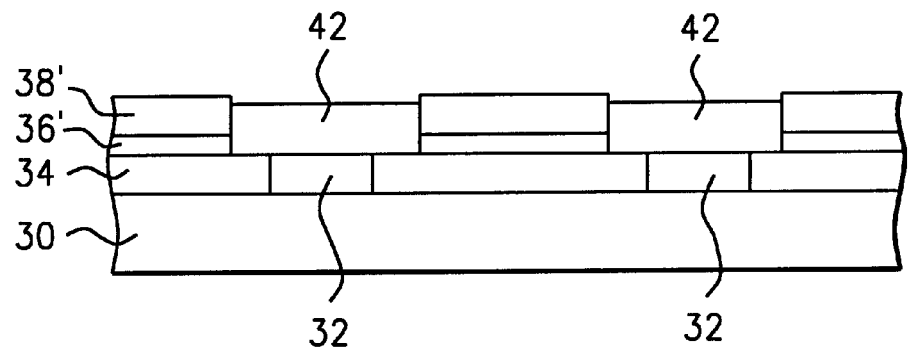

Referring now more particularly to FIG. 7, there is shown a schematic cross-sectional diagram illustrating the results of further processing of the integrated circuit microelectronics fabrication whose schematic cross-sectional diagram s shown in FIG. 6 in accord with the second preferred embodiment of the present invention. Shown in FIG. 7 is an integrated circuit microelectronics fabrication otherwise equivalent to the integrated circuit microelectronics fabrication shown in FIG. 6, but where there has been etched the pattern of the photoresist etch mask layer 40 through the dielectric layer 38' and the diffusion barrier dielectric layer 36' to the conductive layer 32, followed by stripping of the photoresist etch mask layer 40. The etched pattern 41 has been filled with a conductor layer 42.

With respect to the etching of the pattern 41 shown in FIG. 7, the etching of the pattern 41 employs materials and methods suitable to the dielectric material of the dielectric layer 38 and diffusion layer 36, as are known in the art of microelectronics fabrication. The stripping of the photoresist etch mask layer 40 after etching of the pattern 41 is accomplished employing methods and materials as are known in the art of microelectronics fabrication.

With respect to the conductor layer 42 shown in FIG. 7, the conductor layer 42 is a copper metal or alloy layer formed employing methods including but not limited to vacuum evaporation, physical vapor deposition (PVD) sputtering and electrodeposition (ED) methods.

Figure 8:
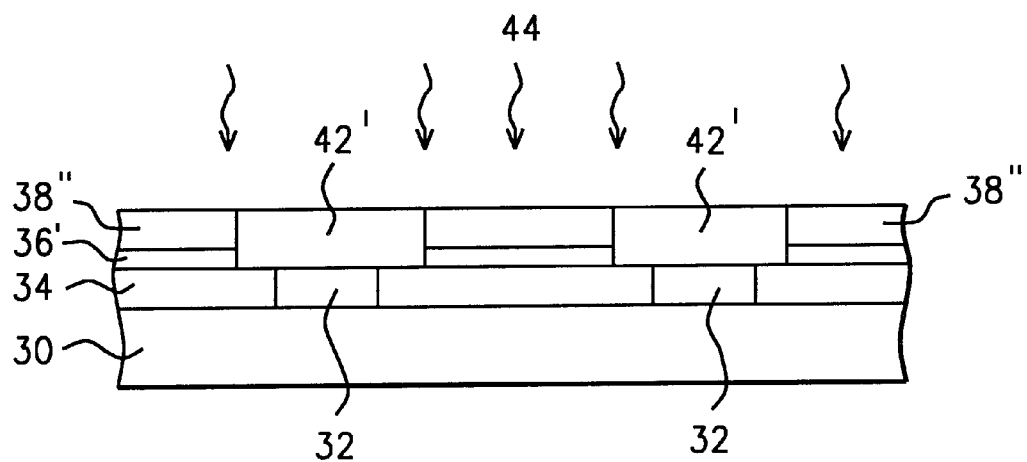

Referring now more particularly to FIG. 8, there is shown a schematic cross-sectional diagram illustrating the results of further processing of the integrated circuit microelectronics fabrication whose schematic cross-sectional diagram is shown in FIG. 7. Shown in FIG. 8 is an integrated circuit microelectronics fabrication otherwise equivalent to the integrated circuit microelectronics fabrication shown in FIG. 7, but where there has been planarized 44 the surface of the dielectric layer 38" and the copper layer 42'.

With respect to the planarization 44 shown in FIG. 8, the planarization 44 employs a chemical mechanical polish (CMP) planarization process as is known in the art of microelectronics fabrication.

The present invention provides a method for forming an inter-level metal dielectric (IMD) layer comprising a low dielectric constant dielectric layer, intermediate diffusion barrier dielectric layer and a copper conductor layer, with attenuated inter-diffusion of species between the dielectric layers and the copper layer.

Experimental

Figure 9:
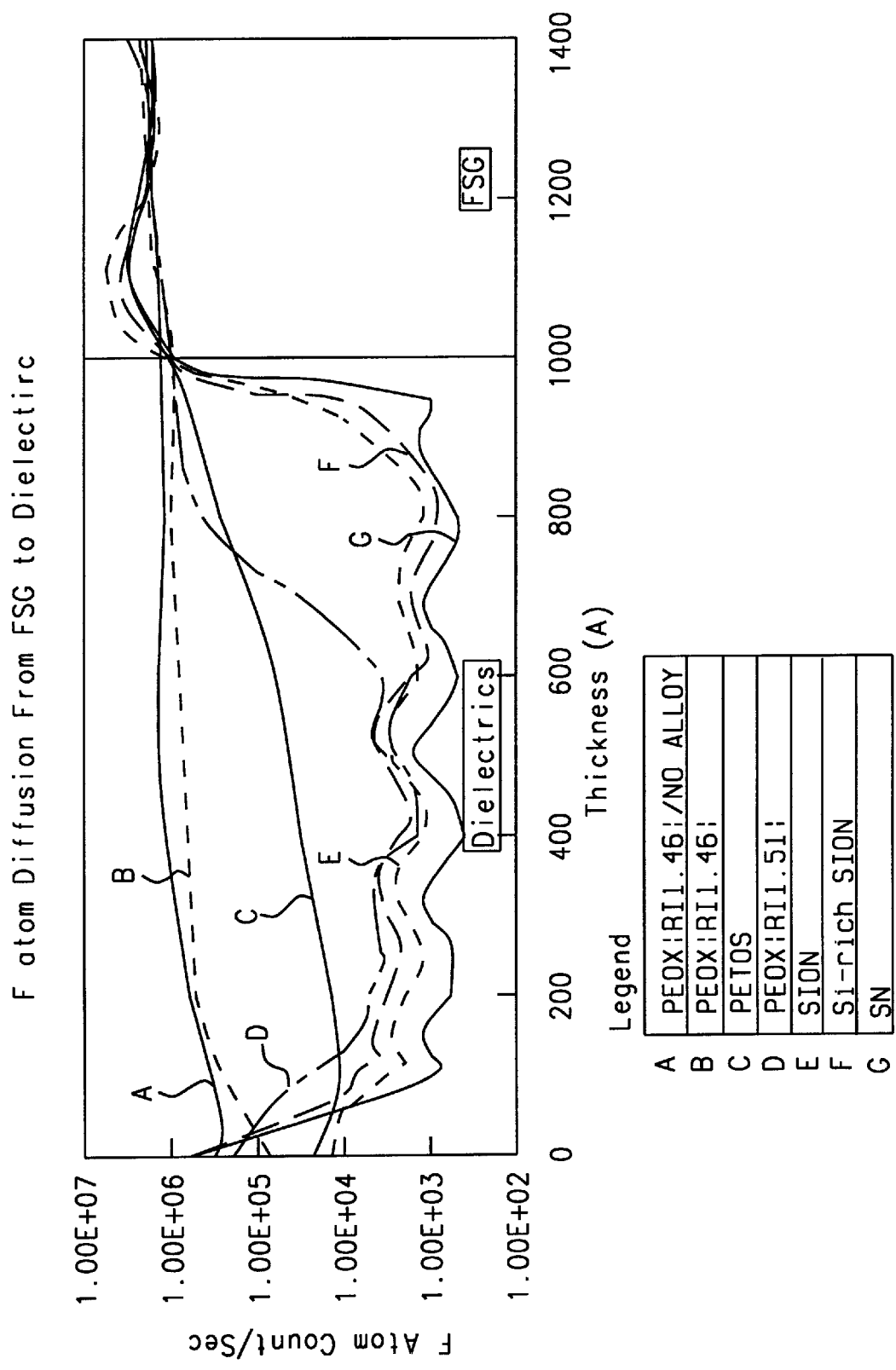
FIG. 9 is a graph showing the diffusion of fluorine species within various dielectric materials.

The benefits and advantages of the preferred embodiments of the present invention are exemplified by the results of experimental measurements performed upon samples fabricated in accord with the present invention. Dielectric layers were formed employing fluorine-doped, silicon containing glass (FSG) dielectric material deposited by HDP-CVD method on silicon semiconductor substrates of (100) orientation to a thickness of 1000 angstroms. Various dielectric materials were formed over the silicon semiconductor substrates and characterized by their composition and/or refractive indices as determined employing ellipsometric and reflectometric measurement methods. The silicon semiconductor substrate samples were treated to an alloying step for two hours at 400 degrees centigrade. The samples were then analysed by secondary ion mass spectrometry (SIMS) and by reflectance back scattering (RBS) methods. The results are shown in FIG. 9, which illustrates the concentration of fluorine species as a function of depth of thickness of the FSG layer adjacent to the various dielectric layers. It can be seen that the diffusion of fluorine species into the silicon-rich silicon oxide dielectric layer is much less than into the other silicon oxide layers formed by PECVD, which are closer to stoichiometric silicon oxide based on the process conditions employed as determined by refractive index measurements. For comparison, the diffusion of fluorine species into silicon nitride and silicon oxynitride dielectric layers included in the sample group are also shown in FIG. 9. These materials are known to be superior diffusion barrier materials, and it may be seen that the silicon rich silicon oxide dielectric layer is nearly as good a diffusion barrier as the layers formed from silicon nitride and silicon oxynitride dielectric materials.

As will be evident to a person skilled in the art, the preferred embodiments of the present invention are illustrative of the present invention rather than limiting of the present invention. Revisions and modifications may be made to the materials, structures and dimensions through which is provided the preferred embodiments of the present invention while still providing embodiments which are within the spirit and scope of the present invention, as defined by the appended claims.

What is claimed is:

1. A method for forming upon a substrate employed within a microelectronics fabrication an inter-level metal dielectric (IMD) layer comprising:

providing a substrate;

forming upon the substrate a patterned microelectronics layer;

forming over the substrate a dielectric layer;

forming over the dielectric layer a silicon rich silicon oxide diffusion barrier dielectric layer; and forming over the substrate a patterned conductor layer.

2. The method of claim 1 wherein there is attenuated inter-diffusion between the dielectric layer and the conductor layer.

3. The method of claim 1 wherein the substrate is employed within a microelectronics fabrication selected from the group consisting of:

integrated circuit microelectronics fabrications;

charge coupled device microelectronics fabrications;

solar cell microelectronics fabrications;

optoelectronics microelectronics fabrications;

ceramic substrate microelectronics fabrications; and flat panel display microelectronics fabrications.

4. The method of claim 1 wherein the patterned microelectronics layer is selected from the group consisting of:

microelectronics conductor layers;

microelectronics semiconductor layers; and microelectronics dielectric layers.

5. The method of claim 1 wherein the dielectric layer is formed employing a fluorine-doped silicon containing and/or carbon-containing dielectric material.

6. The method of claim 1 wherein the diffusion barrier dielectric layer is formed employing plasma enhanced chemical vapor deposition (PECVD) of a silicon-rich silicon oxide dielectric material.

7. The method of claim 6 wherein the silicon rich silicon oxide dielectric diffusion barrier layer material has a refractive index of from about 1.47 to about 1.8.

8. The method of claim 1 wherein the patterned conductor layer is formed from copper or copper alloy conductor material.

9. A method for forming upon a semiconductor substrate employed within an integrated circuit microelectronics fabrication an inter-level metal dielectric (IMD) layer comprising:

providing a semiconductor substrate having formed therein a patterned microelectronics layer and a first dielectric layer employing fluorine-doped low dielectric constant dielectric material;

forming over the semiconductor substrate a silicon rich silicon oxide dielectric diffusion barrier layer;

forming over the substrate a second dielectric layer;

forming over the substrate a patterned photoresist etch mask layer and etching the pattern thereof into the second dielectric layer and diffusion barrier dielectric layer followed by stripping the photoresist etch mask layer;

filling the etched pattern with a copper conductor material; and planarizing the surface of the second dielectric layer and copper layer.

10. The method of claim 9 wherein there is attenuated diffusion of fluorine species from the first low dielectric constant FSG layer into the silicon rich silicon oxide diffusion barrier dielectric layer.

11. The method of claim 9 wherein the semiconductor substrate is a silicon semiconductor substrate.

12. The method of claim 9 wherein the patterned microelectronics layer is formed from materials selected from the group consisting of:

microelectronics conductor materials;

microelectronics semiconductor materials; and microelectronics dielectric materials.

13. The method of claim 9 wherein the first fluorine-containing low dielectric constant dielectric layer is formed from material selected from the group consisting of:

fluorine-doped silicon containing glass (FSG) dielectric material;

fluorine-containing carbon containing dielectric material; and fluorine-containing carbon and/or silicon containing dielectric material.

14. The method of claim 9 wherein the silicon-rich silicon oxide dielectric layer is formed employing plasma enhanced chemical vapor deposition (PECVD).

15. The method of claim 14 wherein the silicon rich silicon oxide dielectric material has a refractive index of from about 1.47 to about 1.8.

16. The method of claim 9 wherein the second dielectric layer is formed employing dielectric material selected from the group consisting of:

silicon containing dielectric material;

fluorine-containing silicon containing glass dielectric material;

fluorine-containing carbon containing dielectric material; and fluorine-containing carbon and silicon containing dielectric material.

17. The method of claim 9 wherein the copper containing conductor material is formed employing electrodeposition (ED) method.

18. The method of claim 9 wherein the planarization process is a chemical mechanical polish (CMP) planarization process.

* * * * *